(12) United States Patent
Yang (10) Patent No.: US 10,948,001 B2
(45) Date of Patent: Mar. 16, 2021

(54) AUTOMATIC CLAMPING HOLDER FOR MOBILE DEVICE (71) Applicant: Shenzhen Annaijia Electronics Co., Ltd, Shenzhen (CN)

(72) Inventor: Weiyu Yang, Shenzhen (CN)

(73) Assignee: SHENZHEN ANNAIJIA ELECTRONICS CO., LTD., Shenzhen (CN)

( * ) Notice: Subject to any disclaimer, the term of this patent is extended or adjusted under 35 U.S.C. 154(b) by 55 days.

(21) Appl. No.: 16/412,425

(22) Filed: May 15, 2019

(65) Prior Publication Data
US 2020/0191178 A1    Jun. 18, 2020

(30) Foreign Application Priority Data

Dec. 14, 2018   (CN) .......................... 201822101929.X (51) Int. Cl.
*F16B 2/02*      (2006.01)
*H04M 1/02*    (2006.01)
*H05K 5/02*    (2006.01)

(52) U.S. Cl.
CPC ............... *F16B 2/02* (2013.01); *H04M 1/026* (2013.01); *H05K 5/0204* (2013.01)

(58) Field of Classification Search
CPC .......... F16B 2/02; H04M 1/026; H04M 1/04; H05K 5/0204; F16M 13/022; F16M 11/041; F16M 13/00; B60R 11/02; B60R 11/0241; B60R 2011/0056; B60R 2011/0059; B60R 2011/0071; H04B 1/3877

See application file for complete search history.

(56) References Cited

U.S. PATENT DOCUMENTS

| 5,825,874 A * | 10/1998 | Humphreys ........ B60R 11/0241 |
| | | 379/446 |
| 6,095,470 A * | 8/2000 | Kalis ....................... B60R 11/02 |
| | | 248/309.1 |
| 7,272,984 B2 * | 9/2007 | Fan .......................... B60R 11/02 |
| | | 248/231.61 |
| 7,537,190 B2 * | 5/2009 | Fan .......................... B60R 11/02 |
| | | 248/309.1 |
| 8,998,048 B1 * | 4/2015 | Wu ......................... F16M 13/00 |
| | | 224/420 |
| 9,749,002 B1 * | 8/2017 | Fan ....................... H04B 1/3888 |
| 10,598,199 B1 * | 3/2020 | Fan ......................... B60R 11/02 |
| 2005/0156088 A1 * | 7/2005 | Wadsworth ............. B60R 11/02 |
| | | 248/309.1 |
| 2010/0295228 A1 * | 11/2010 | Woody ................ B60R 11/0258 |
| | | 269/254 R |
| 2014/0009900 A1 * | 1/2014 | Yeo ....................... H04B 1/3888 |
| | | 361/809 |
| 2016/0325693 A1 * | 11/2016 | Kim ...................... F16M 11/041 |
| 2017/0136960 A1 * | 5/2017 | Kim ......................... B60R 11/02 |

* cited by examiner

Primary Examiner — Christopher Garft
(74) Attorney, Agent, or Firm — Leong C. Lei (57) ABSTRACT An automatic clamping holder for a mobile device includes a base, a bottom support arm, left and right clamping arms, left and right pressing arms, and a trigger mechanism. The base is provided with left and right slide grooves. A first elastic member is disposed in each of the left and right slide grooves. The holder is provided with the trigger mechanism and the left and right pressing arms for controlling the opening and closing of the holder. The mobile device can be placed in or taken out from the holder more quickly and flexibly, thereby providing convenience for the user.

9 Claims, 11 Drawing Sheets

AUTOMATIC CLAMPING HOLDER FOR MOBILE DEVICE

BACKGROUND OF THE INVENTION

1. Field of the Invention

The present invention relates to vehicle-mount accessories, and more particularly to an automatic clamping holder for a mobile device.

2. Description of the Prior Art

These days, mobile phones have become an indispensable accessory in our daily life. With the advancement of wireless communication technology, mobile phones are developed towards diversification to be more powerful. People spend more time on their mobile phones. Mobile phones are portable, so people can go online, play games, make friends, etc. on their mobile phones anytime, anywhere. In order to make the user more comfortable and convenient to enjoy the modern life, manufacturers have launched a variety of mobile phone holders. In the prior art, the mobile phone holder is composed of a base, a hose, a retaining support and a retaining clamp. The disadvantage of this structure is that the mobile phone cannot be held better. It is easy to cause the mobile phone to fall off from the retaining clamp to damage the mobile phone. Especially, when the user drives a car or only hand is available for placing the mobile phone, it is very inconvenient for the user to retain the mobile phone on the mobile phone holder with both hands. Accordingly, the inventor of the present invention has devoted himself based on his many years of practical experiences to solve these problems.

SUMMARY OF THE INVENTION

In view of the shortcomings of the prior art, the primary object of the present invention is to provide an automatic clamping holder for a mobile device. The holder is provided with a trigger mechanism and left and right pressing arms for controlling the opening and closing of the holder. The mobile device can be placed in or taken out from the holder more quickly and flexibly, thereby providing convenience for the user.

In order to achieve the above object, the present invention adopts the following technical solutions:

An automatic clamping holder comprises a base, a bottom support arm disposed at a lower part of the base, a left clamping arm and a right clamping arm movably mounted to an upper part of the base, a left pressing arm movably connected to the left clamping arm for driving the left clamping arm to slide toward a left side of the base, a right pressing arm movably connected to the right clamping arm for driving the right clamping arm to slide toward a right side of the base, and a trigger mechanism that is movable to lean against the left clamping arm and the right clamping for opening the left clamping arm and the right clamping arm or to disengage from the left clamping arm and the right clamping arm for closing the left clamping arm and the right clamping arm. An accommodating area for accommodating a mobile device is defined among the bottom support arm, the left clamping arm, the right clamping arm and the base. The base is provided with a left slide groove for the left clamping arm to slide transversely and a right slide groove for the right clamping arm to slide transversely. A first elastic member is disposed in each of the left slide groove and the right slide groove for driving the left clamping arm and the right clamping arm to slide oppositely. The left pressing arm and the right pressing arm each include a connecting portion located at an upper end, a pivot portion located at a middle portion, and a pressing portion located at a lower end. The connecting portion of the left pressing arm is movably connected to an inner end of the left clamping arm. The pivot portion of the left pressing arm is rotatably mounted on the base. The pressing portion of the left pressing arm extends out of the base. The connecting portion of the right pressing arm is movably connected to an inner end of the right clamping arm. The pivot portion of the right pressing arm is rotatably mounted on the base. The pressing portion of the right pressing arm extends out of the base. The trigger mechanism includes a button, a limiting plate, and a second elastic member. The button is mounted to an upper end of the limiting plate and extends outwardly to be located in the accommodating area. The second elastic member is connected between a lower end of the limiting plate and the base. The limiting plate is movable to disengage from the left clamping arm and the right clamping arm or to lean against the left clamping arm and the right clamping arm along with movement of the button or the left and right pressing arms.

The invention has obvious advantages and beneficial effects compared with the prior art, in particular, it can be known from the above technical solutions. The holder is provided with the trigger mechanism for the left and right clamping arms to clamp the mobile device automatically and the pressing arms for manually separating the left and right clamping arms from each other. For placing a mobile device, the holder can clamp the mobile device automatically when the mobile device touches the button. When the mobile device is taken out, the holder can be opened by simply pressing the pressing arms with one hand. The operation is quick and flexible to provide convenience for the user.

DETAILED DESCRIPTION OF THE PREFERRED EMBODIMENTS

Figure 1:
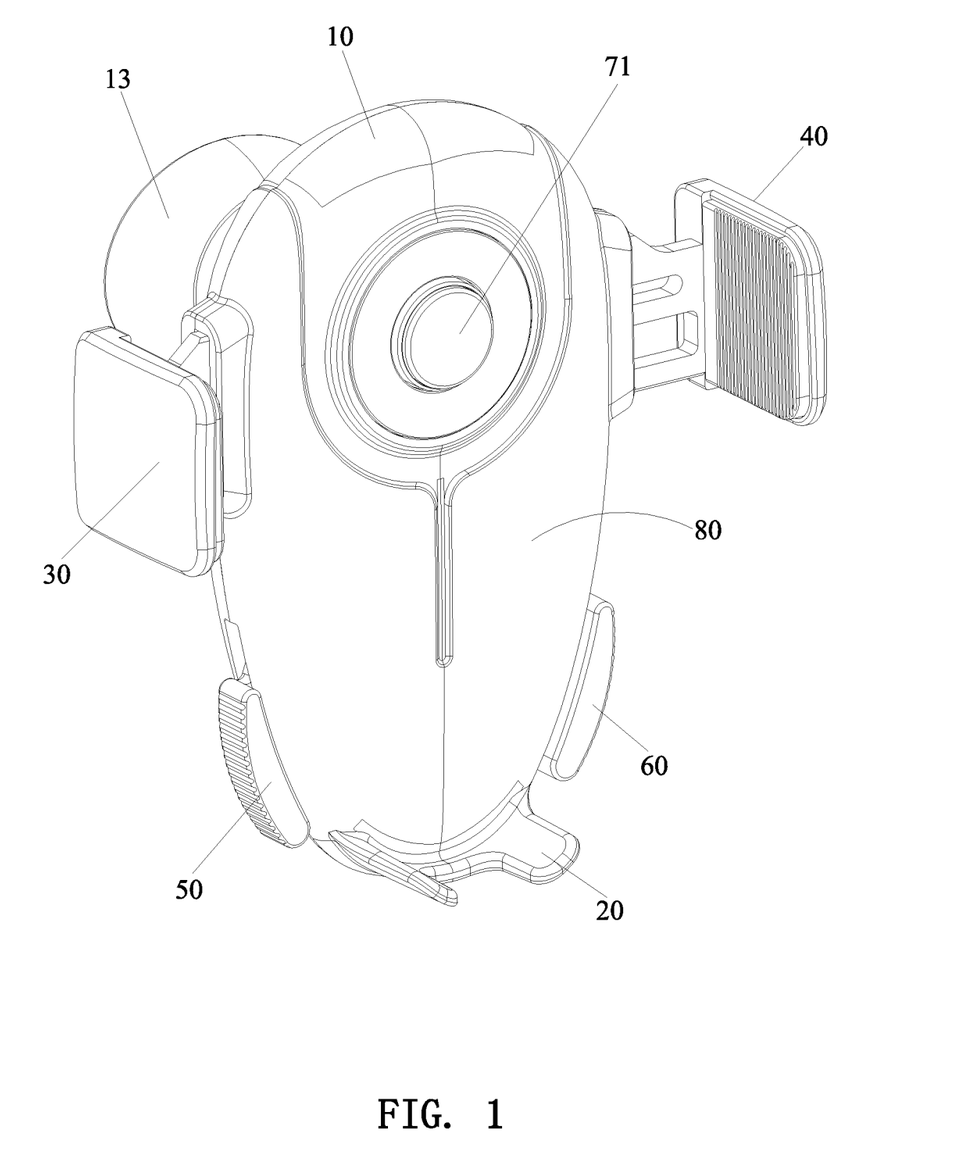
FIG. 1 is a perspective view of the holder of the present invention in an open state.
Figure 2:
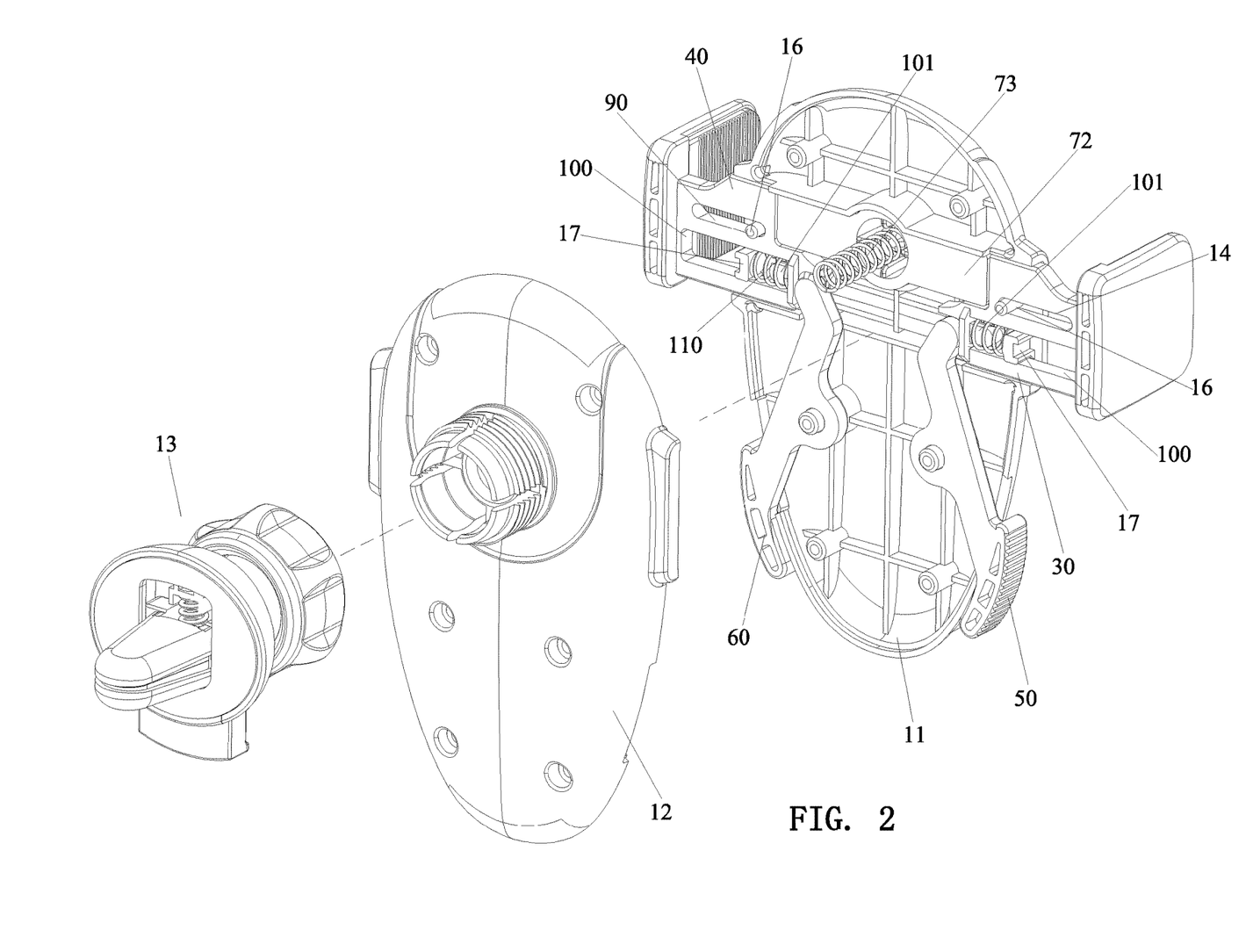
FIG. 2 is an exploded view of the holder of the present invention in an open state.
Figure 3:
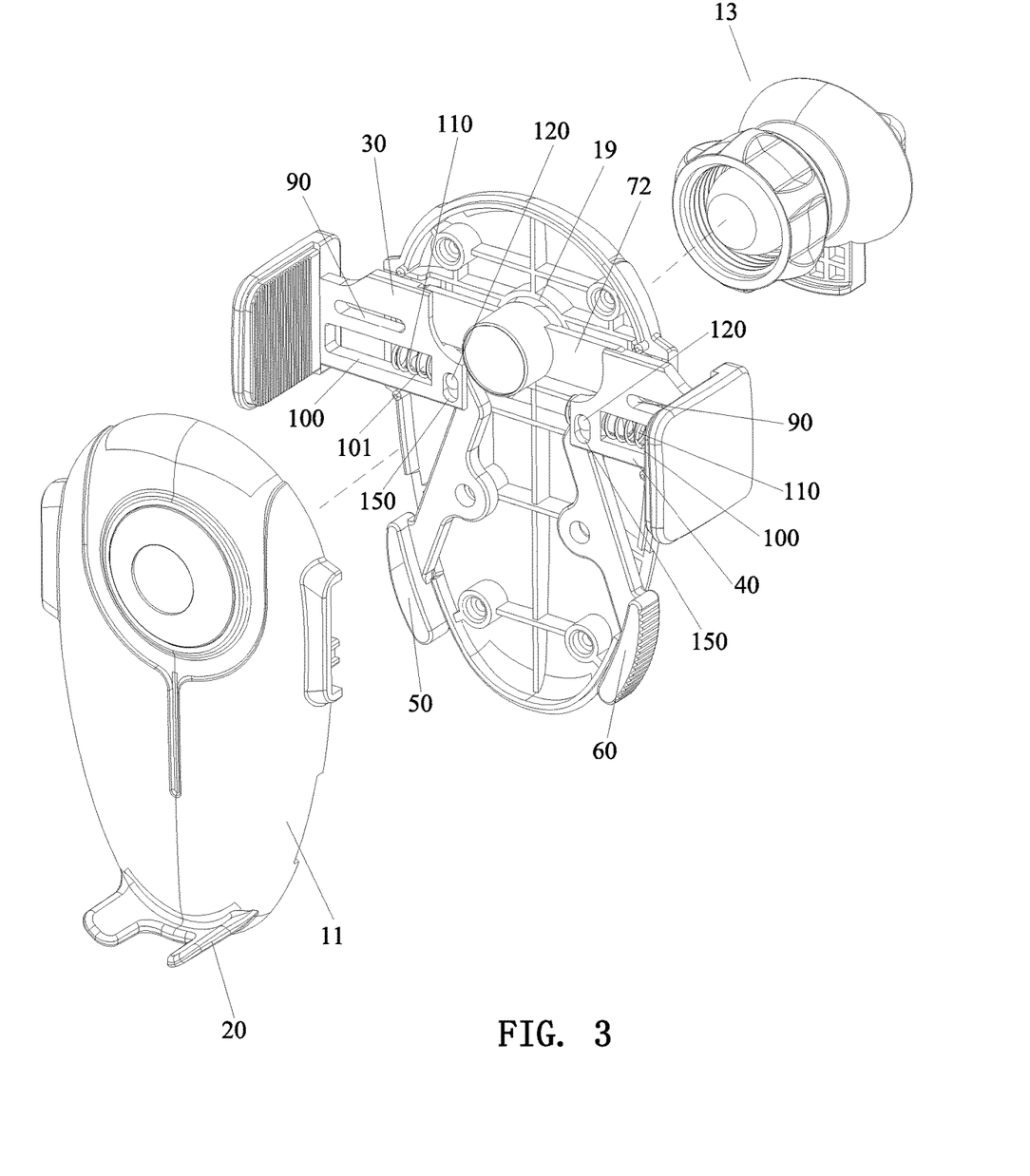
FIG. 3 is another exploded view of the holder of the present invention in an open state.
Figure 4:
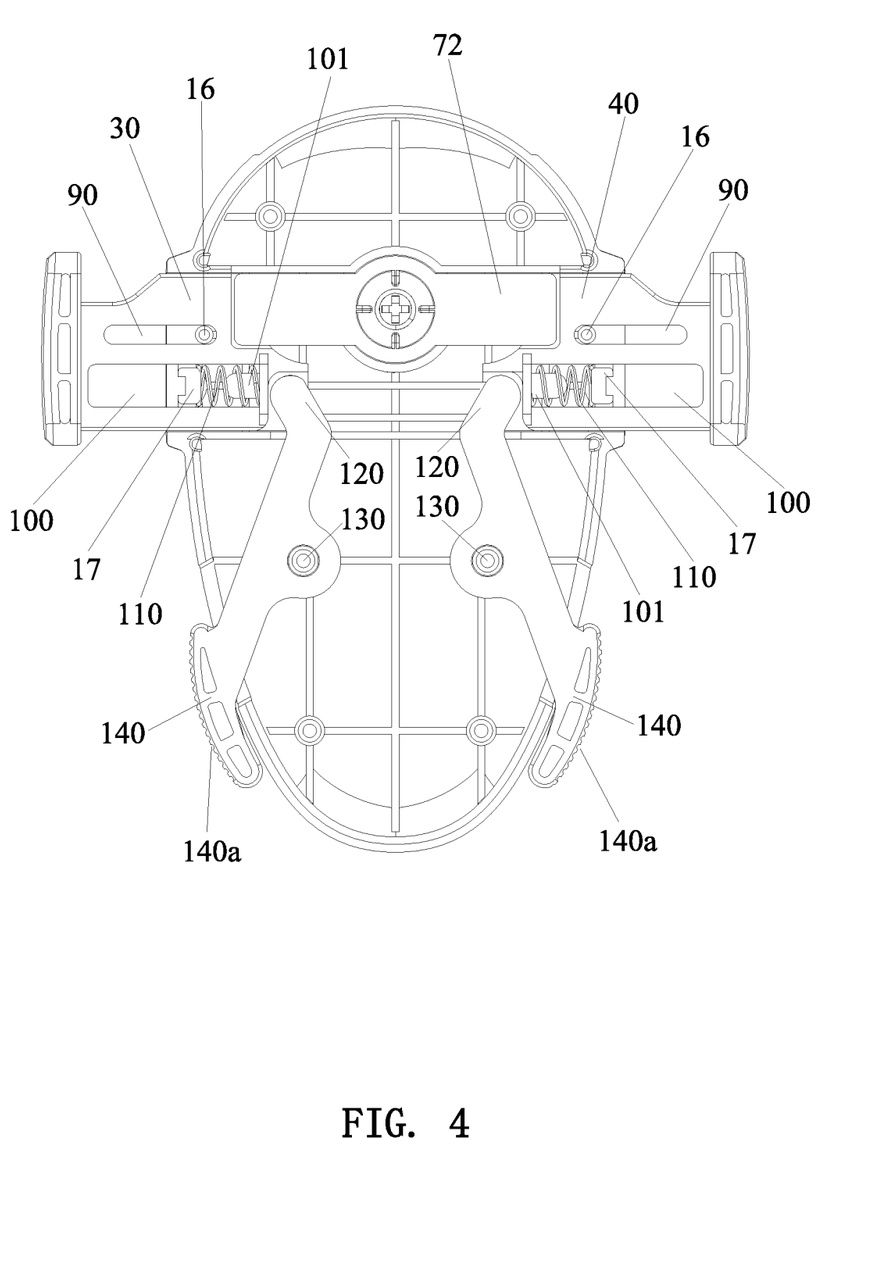
FIG. 4 is a schematic view showing the left and right clamping arms, the left and right pressing arms and the trigger mechanism of the holder of the present invention in an open state.
Figure 5:
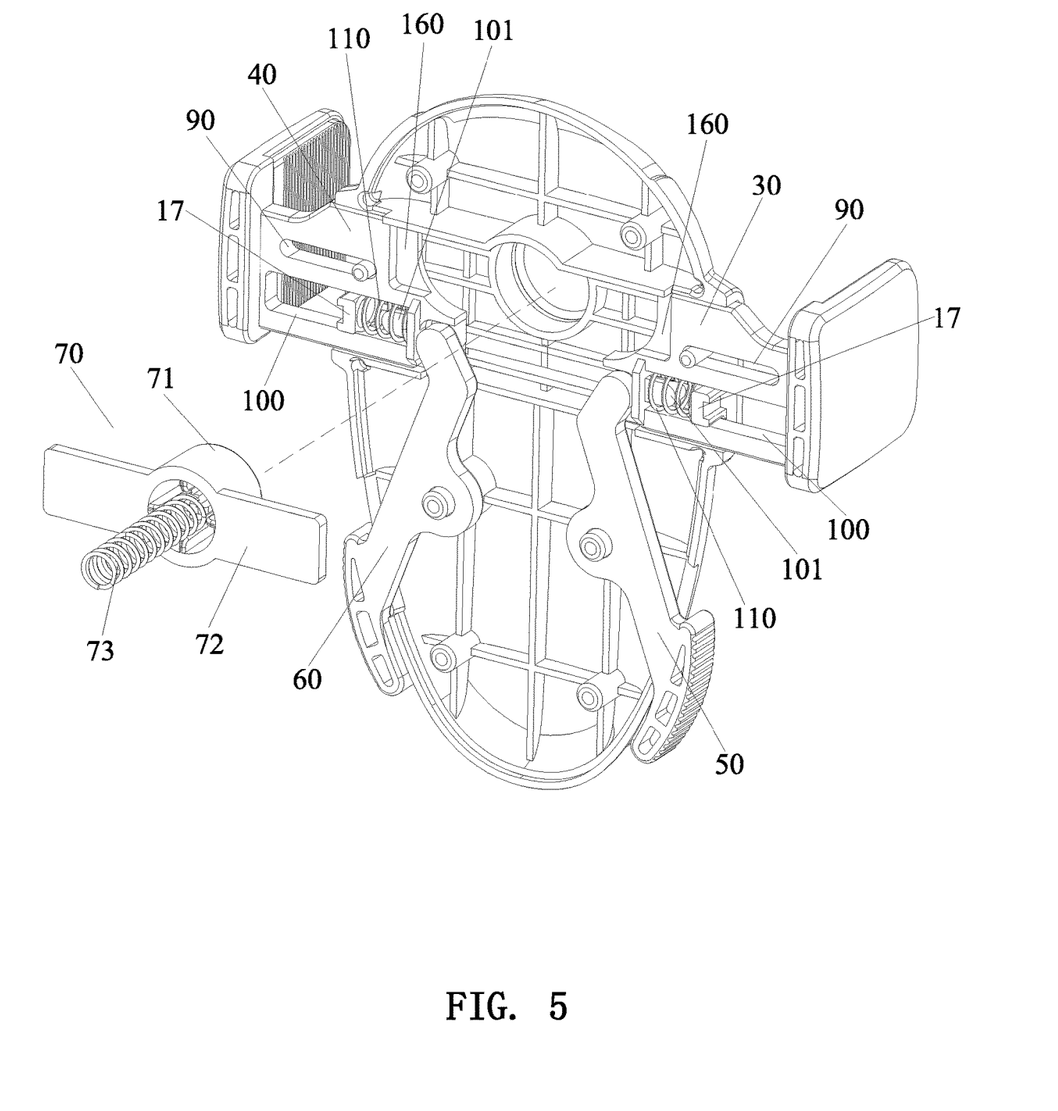
FIG. 5 is a schematic view of the holder of the present invention in an open state, showing that the trigger mechanism is separated from the left and right clamping arms.
Figure 6:
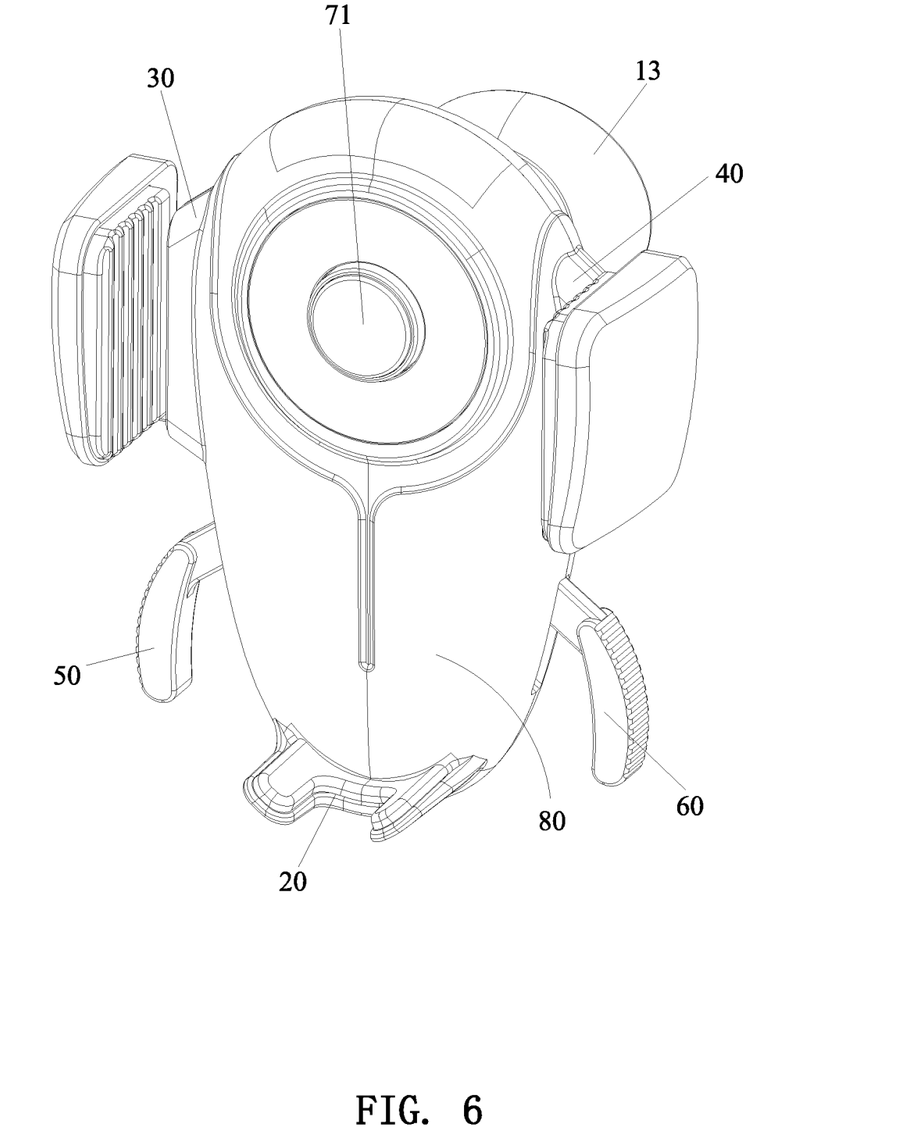
FIG. 6 is a perspective view of the holder of the present invention in a closed state.
Figure 7:
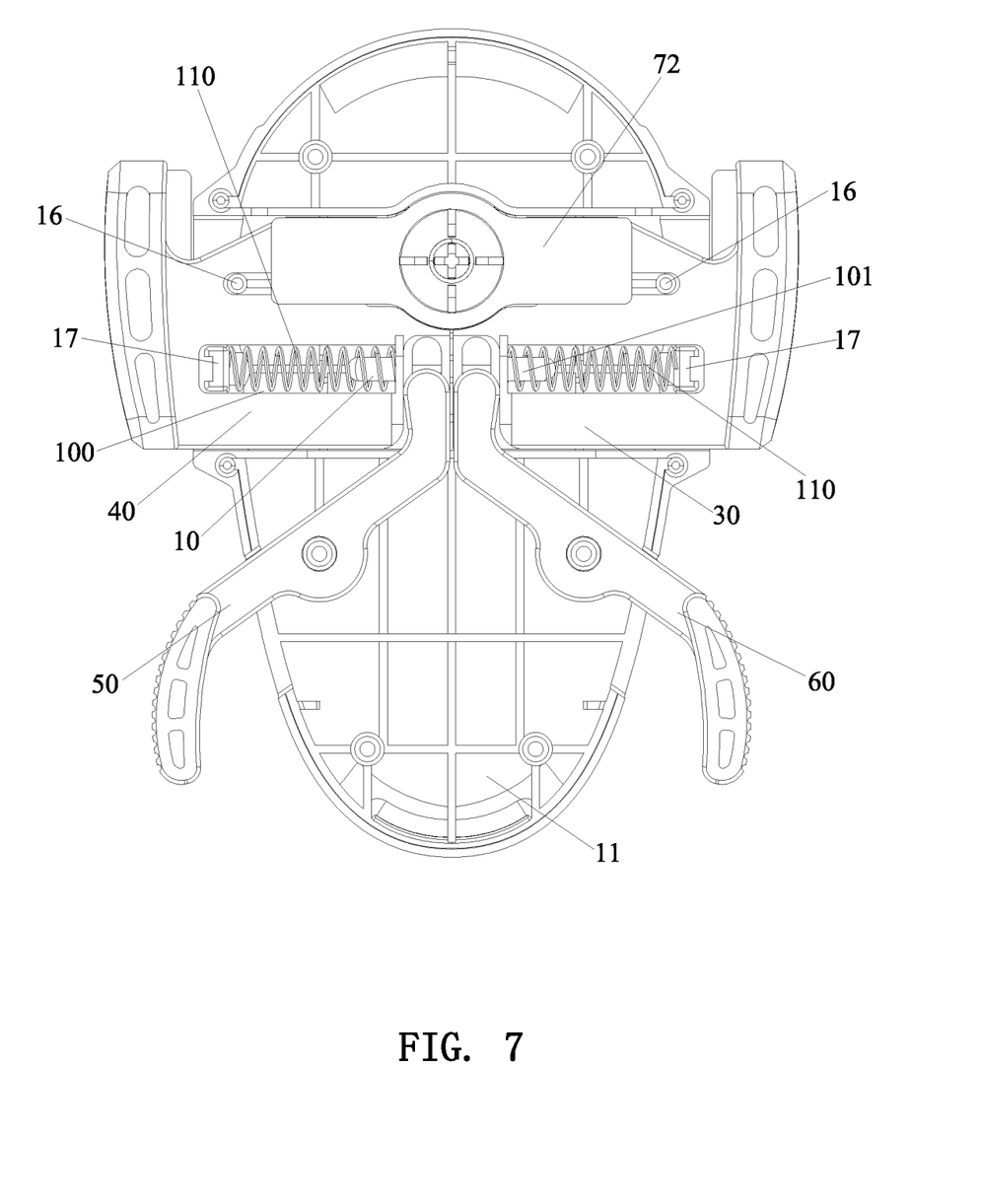
FIG. 7 is a schematic view showing the left and right clamping arms, the left and right pressing arms and the trigger mechanism of the holder of the present invention in a closed state.
Figure 8:
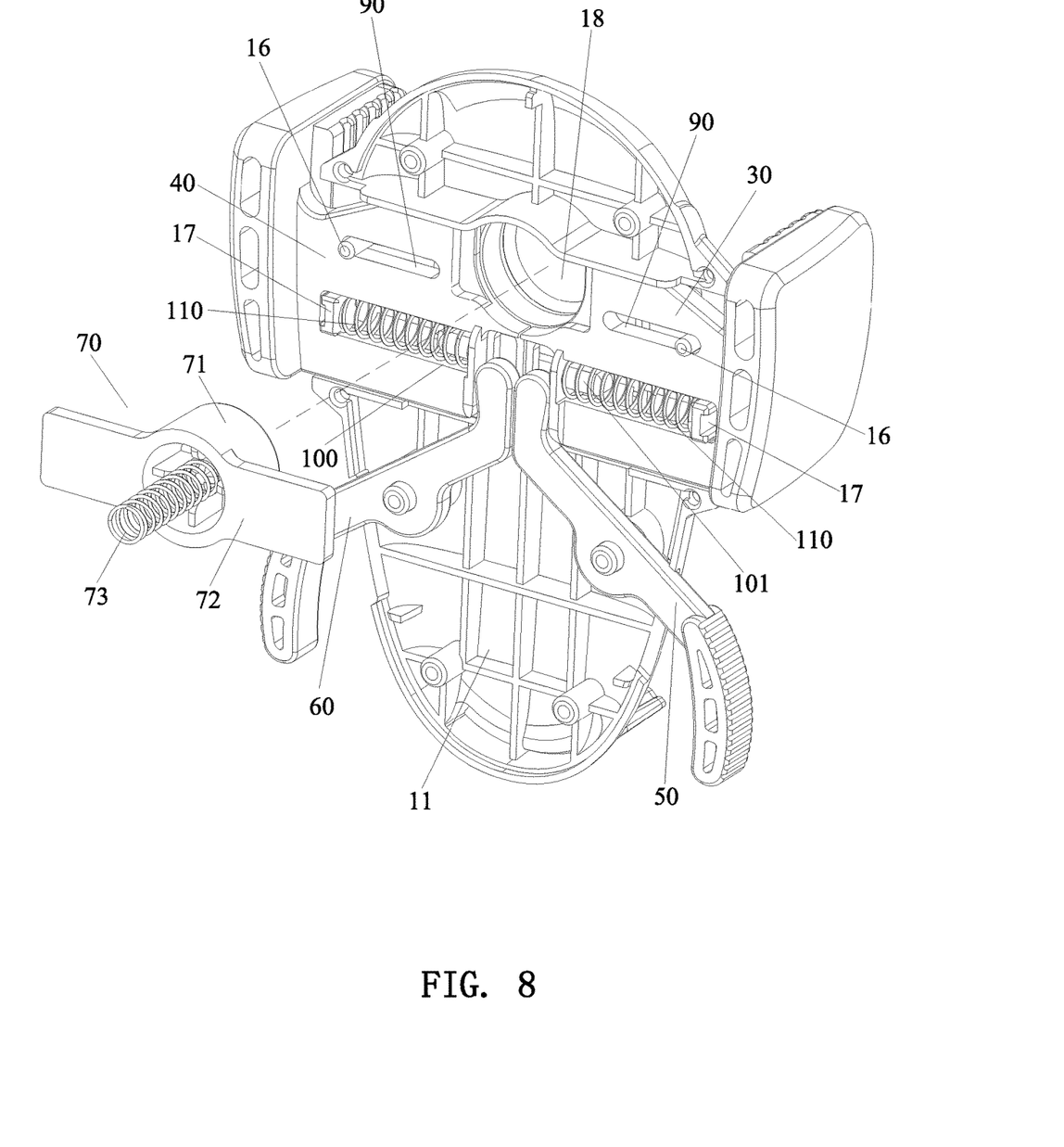
FIG. 8 is a schematic view of the holder of the present invention in a closed state, showing that the trigger mechanism is separated from the left and right clamping arms.
Figure 9:
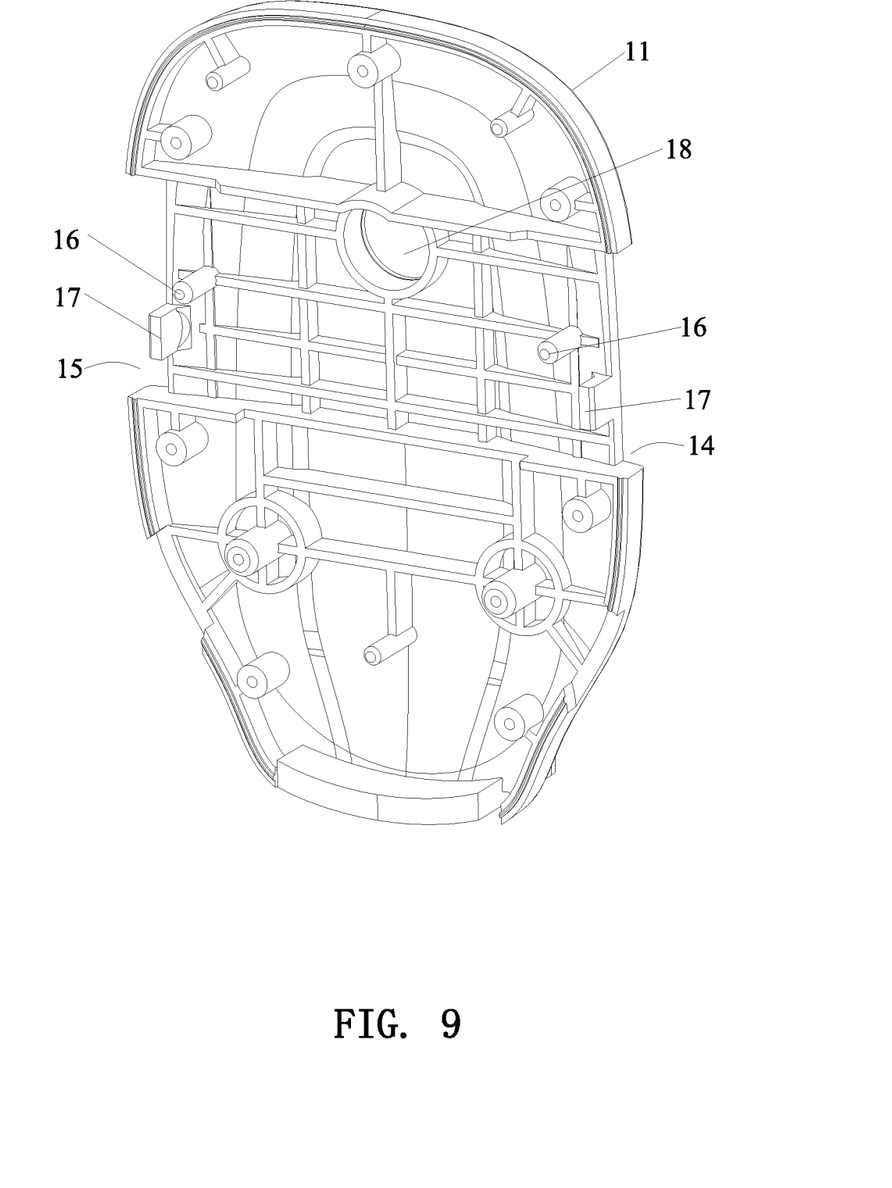
FIG. 9 is a schematic view showing the left slide groove and the right slide groove of the present invention.
Figure 10:
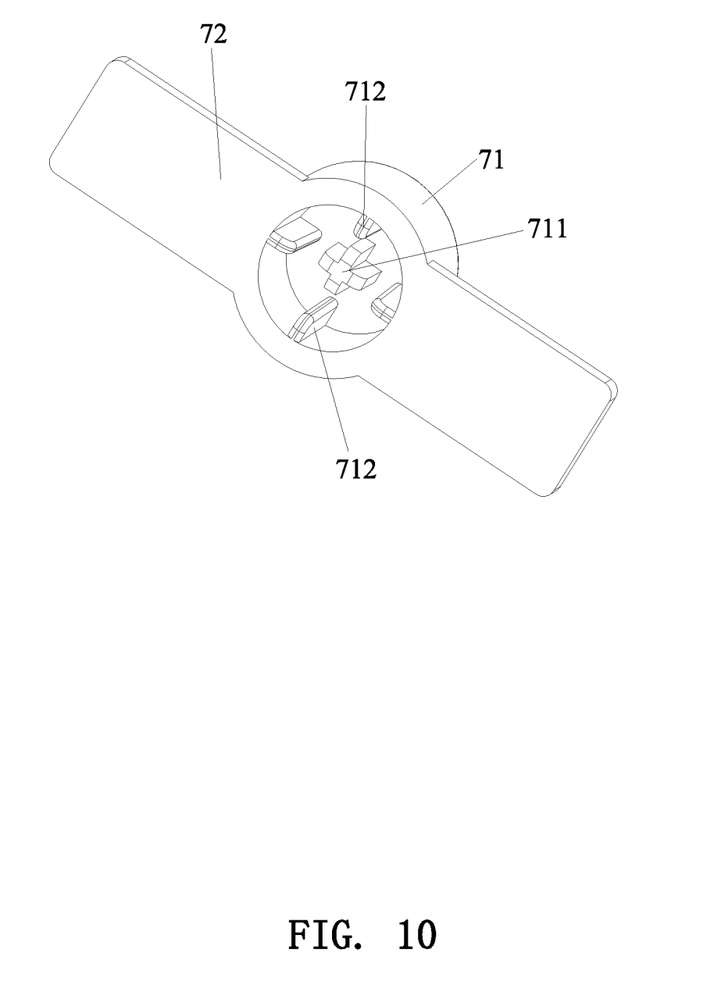
FIG. 10 is a schematic view showing the button and the limiting plate of the present invention.
Figure 11:
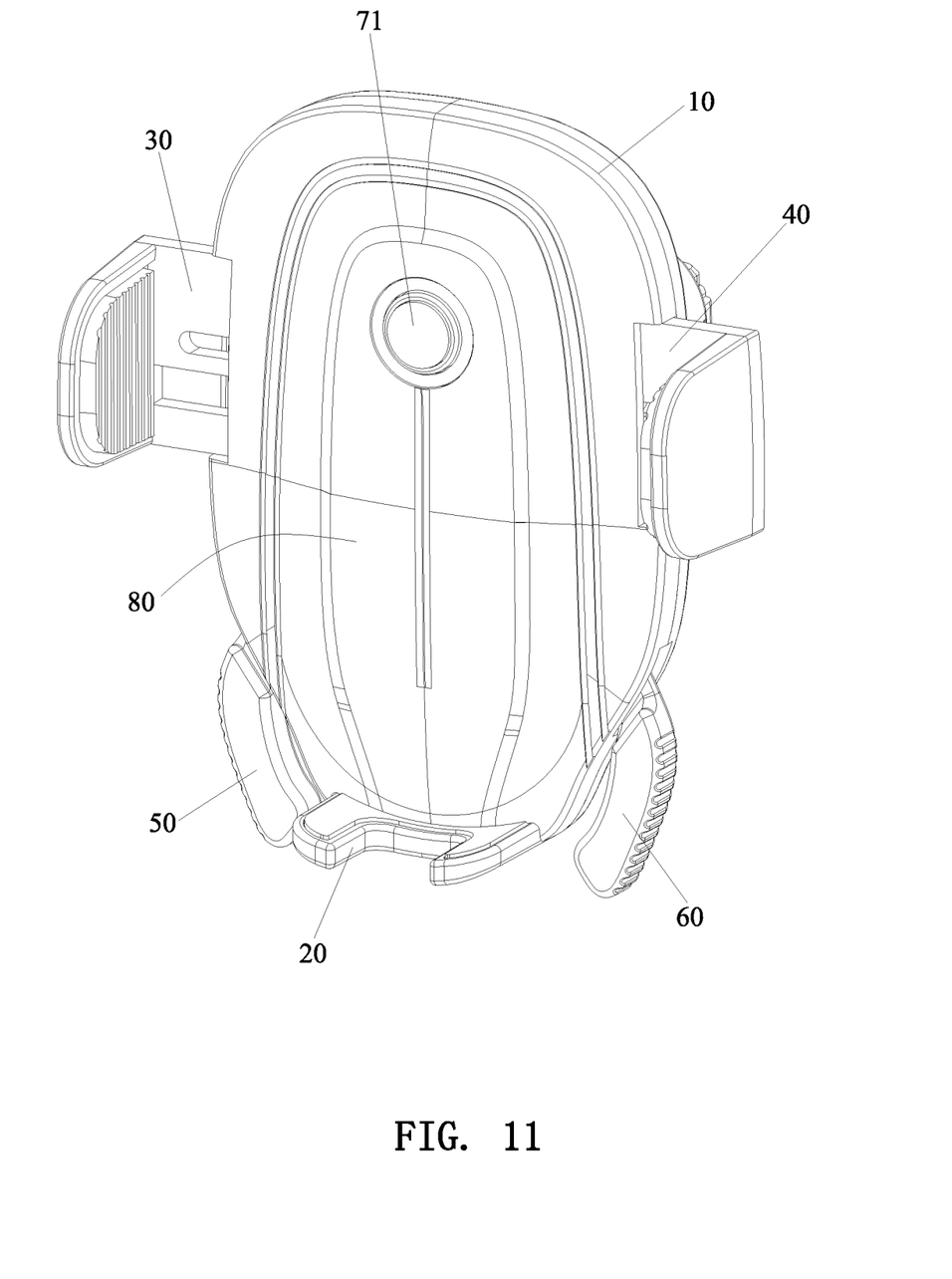
FIG. 11 is a perspective view showing another holder of the present invention.

As shown in FIG. 1 to FIG. 11, the present invention discloses an automatic clamping holder for a mobile device, comprising a base 10, a bottom support arm 20, a left clamping arm 30, a right clamping arm 40, a left pressing arm 50, and a right pressing arm 60, and a trigger mechanism 70.

The base 10 includes a front housing 11 and a rear housing 12 coupled to the front housing 11. The bottom support arm 20 is integrally fixed to the lower end of the front housing 11 or the rear housing 12. (The bottom support arm may be threadedly connected to the base 10 by a screw). A retaining seat 13 for retaining the holder is disposed on the rear side of the rear housing 12.

The left clamping arm 30 and the right clamping arm 40 are movably mounted to the upper portion of the base 10. An accommodating area 80 for accommodating a mobile device is defined among the left clamping arm 30, the right clamping arm 40, the bottom support arm 20 and the base 10. The base 10 is provided with a left slide groove 14 for the left clamping arm 30 to slide transversely and a right slide groove 15 for the right clamping arm 40 to slide transversely. A guiding post 16 is disposed in each of the left slide groove 14 and the right slide groove 15. The left clamping arm 30 and the right clamping arm 40 each have a guiding slot 90 corresponding to the guiding post 16. The guiding post 16 is located in the guiding slot 90. In addition, the left clamping arm 30 and the right clamping arm 40 each have a limiting slot 100 that is disposed transversely. The inner side of the limiting slot 100 is integrally formed with a connecting post 101 extending transversely. A limiting block 17 is disposed in each of the left slide groove 14 and the right slide groove 15. The limiting block 17 is inserted into the limiting slot 100. A first elastic member 110 is connected between the connecting post 101 and the limiting block 17. The first elastic member 110 provides an elastic force for driving the left clamping arm 30 and the right clamping arm 40 to slide oppositely.

The left pressing arm 50 is used for driving the left clamping arm 30 to slide toward the left side of the base 10. The right pressing arm 60 is used for driving the right clamping arm 40 to slide toward the right side of the base 10. The left pressing arm 50 and the right pressing arm 60 each include a connecting portion 120 located at an upper end, a pivot portion 130 located at a middle portion, and a pressing portion 140 located at a lower end. The connecting portions 120 of the left and right pressing arms are movably connected to the inner ends of the left clamping arm 30 and the right clamping arm 40, respectively. Specifically, the inner end of each of the left clamping arm 30 and the right clamping arm 40 is provided with a vertical connecting groove 150. The connecting portion 120 of each of the left pressing arm 30 and the right pressing arm 40 is a post extending downward vertically. The post is movably inserted into the vertical connecting groove 150. The pivot portion 130 of each of the left pressing arm 30 and the right pressing arm 40 is rotatably mounted on the base 10. The pressing portion 140 of each of the left pressing arm 30 and the right pressing arm 40 extends out of the base 10. The pressing portion 140 is provided with an anti-slip pattern 140a, thereby facilitating the user's hand to press the pressing portion 140. The left pressing arm 50 and the right pressing arm 60 are symmetrically mounted to the base 10. When the two pressing portions 140 of the left pressing arm 50 and the right pressing arm 60 are pressed by the hand, the connecting portions 120 of the left pressing arm 50 and the right pressing arm 60 will bring the left and right clamping arms 30, 40 to slide outward.

When the trigger mechanism 70 is pressed between the left clamping arm 30 and the right clamping arm 40, the left clamping arm 30 and the right clamping arm 40 are opened oppositely. When the trigger mechanism 70 is disengaged from the left clamping arm 30 and the right clamping arm 40, the left clamping arm 30 and the right clamping arm 40 are elastically closed to each other. The trigger mechanism 70 includes a button 71, a limiting plate 72, and a second elastic member 73. The button 71 is integrally disposed on the upper surface of the limiting plate 72. The base 10 is provided with a through hole 18 corresponding to the button 71. The button 71 passes through the through hole 18 to be located in the accommodating area 80. The inside of the button 71 is hollow. The lower end of the button 71 is integrally connected with the lower end of the limiting plate 72. The inside of the button 71 is provided with a positioning post 711 for retaining the second elastic member 73 and a plurality of limiting ribs 712 surrounding the positioning post 711. The upper end of the second elastic member 73 is held between the positioning post 711 and the plurality of limiting ribs 712. The base 10 is provided with an annular limiting recess 19 corresponding to the lower end of the second elastic member 73. The lower end of the second elastic member 73 is engaged in the annular limiting recess 19. Both ends of the second elastic member 73 are retained in the above manner so that they are kept in an upright state when pressed, preventing failure due to insufficient elasticity.

The limiting plate 72 is a strip-shaped plate. The inner ends of the left clamping arm 30 and the right clamping arm 40 are respectively recessed to form a limiting recess 160 matching two ends of the limiting plate 72. The two ends of the limiting plate 72 are detachably matched with the limiting recess 160. The depth of the limiting recess 160 corresponds to the thickness of the limiting plate 72. When the limiting plate 72 is inserted in the limiting recess 160, the limiting plate 72 is flush with the left clamping arm 30 and the right clamping arm 40.

The use and the working principle of the holder are described below. In the initial state of the holder, the left clamping arm 30 and the right clamping arm 40 are separated from each other, that is, the accommodating area 80 is in an open state. When a mobile phone is placed in the accommodating area 80, the button 71 is pressed backward, the second elastic member 73 is compressed, and the limiting plate 72 is moved downward to disengage from the left clamping arm 30 and the right clamping arm 40. The left clamping arm 30 and the right clamping arm 40 are pushed by the two first elastic members 10 to approach each other for clamping the mobile phone. When the user wants to take out the mobile phone, the pressing portions 140 of the left and right pressing arms are pressed simultaneously, the left and right clamping arms are separated from each other under the pushing of the left and right pressing arms to overcome the elastic force of the first elastic members 110 until the limiting recess 160 of the left and right clamping arms is aligned with the limiting plate 72. The limiting plate 72 is engaged in the limiting recess 160 under the elastic force of the second elastic member 73. The limiting plate 72 is located between the left and right clamping arms to separate the left and right clamping arms from each other. At this time, the user releases the left and right pressing arms, and the accommodating area 80 is kept in an open state, so that the mobile phone can be taken out.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An automatic clamping holder, comprising a base, a bottom support arm disposed at a lower part of the base, a left clamping arm and a right clamping arm movably mounted to an upper part of the base, a left pressing arm movably connected to the left clamping arm for driving the left clamping arm to slide toward a left side of the base, a right pressing arm movably connected to the right clamping arm for driving the right clamping arm to slide toward a right side of the base, and a trigger mechanism that is movable to lean against the left clamping arm and the right clamping for opening the left clamping arm and the right clamping arm or to disengage from the left clamping arm and the right clamping arm for closing the left clamping arm and the right clamping arm; an accommodating area for accommodating a mobile device being defined among the bottom support arm, the left clamping arm, the right clamping arm and the base; the base being provided with a left slide groove for the left clamping arm to slide transversely and a right slide groove for the right clamping arm to slide transversely, a first elastic member being disposed in each of the left slide groove and the right slide groove for driving the left clamping arm and the right clamping arm to slide oppositely; the left pressing arm and the right pressing arm each including a connecting portion located at an upper end, a pivot portion located at a middle portion, and a pressing portion located at a lower end, the connecting portion of the left pressing arm being movably connected to an inner end of the left clamping arm, the pivot portion of the left pressing arm being rotatably mounted on the base, the pressing portion of the left pressing arm extending out of the base; the connecting portion of the right pressing arm being movably connected to an inner end of the right clamping arm, the pivot portion of the right pressing arm being rotatably mounted on the base, the pressing portion of the right pressing arm extending out of the base; the trigger mechanism including a button, a limiting plate and a second elastic member, the button being mounted to an upper end of the limiting plate and extending outwardly to be located in the accommodating area, the second elastic member being connected between a lower end of the limiting plate and the base, the limiting plate being movable to disengage from the left clamping arm and the right clamping arm or to lean against the left clamping arm and the right clamping arm along with movement of the button or the left and right pressing arms; wherein a guiding post is disposed in each of the left slide groove and the right slide groove, the left clamping arm and the right clamping arm each have a guiding slot corresponding to the guiding post, and the guiding post is located in the guiding slot.

2. The automatic clamping holder as claimed in claim 1, wherein the inner ends of the left clamping arm and the right clamping arm are respectively recessed to form a limiting recess matching with two ends of the limiting plate, and the two ends of the limiting plate are detachably matched with the limiting recess.

3. The automatic clamping holder as claimed in claim 1, wherein the inner end of each of the left clamping arm and the right clamping arm is provided with a vertical connecting groove, the connecting portion of each of the left pressing arm and the right pressing arm is a post extending downward vertically, and the post is movably inserted into the vertical connecting groove.

4. The automatic clamping holder as claimed in claim 1, wherein the left clamping arm and the right clamping arm each have a limiting slot that is disposed transversely, an inner side of the limiting slot is integrally formed with a connecting post extending transversely, a limiting block is disposed in each of the left slide groove and the right slide groove, one end of the first elastic member is connected to the connecting post, and another end of the first elastic member is pressed against the limiting block.

5. The automatic clamping holder as claimed in claim 1, wherein the button is integrally disposed on an upper surface of the limiting plate, the base is provided with a through hole corresponding to the button, and the button extends out of the through hole.

6. The automatic clamping holder as claimed in claim 1, wherein the pressing portion of each of the left pressing arm and the right pressing arm is provided with an anti-slip pattern.

7. The automatic clamping holder as claimed in claim 2, wherein the limiting plate is a strip-shaped plate, and the limiting recess has a depth corresponding to a thickness of the limiting plate.

8. The automatic clamping holder as claimed in claim 1, wherein an inside of the button is hollow, the inside of the button is provided with a positioning post for retaining the second elastic member and a plurality of limiting ribs surrounding the positioning post, an upper end of the second elastic member is held between the positioning post and the plurality of limiting ribs; the base is provided with an annular limiting recess corresponding to a lower end of the second elastic member, and the lower end of the second elastic member is engaged in the annular limiting recess.

9. The automatic clamping holder as claimed in claim 1, wherein the base includes a front housing and a rear housing coupled to the front housing, the bottom support arm is disposed at a lower end of the front housing or the rear housing, and a retaining seat for retaining the automatic clamping holder is disposed on a rear side of the rear housing.

\* \* \* \* \*